US012644946B2

(12) United States Patent
Grodzki

(10) Patent No.: US 12,644,946 B2
(45) Date of Patent: Jun. 2, 2026

(54) METHOD FOR DETERMINING A RADIO-FREQUENCY TRANSMISSION PULSE FOR A MAGNETIC RESONANCE SCAN, A MAGNETIC RESONANCE APPARATUS, AND A COMPUTER PROGRAM PRODUCT

(71) Applicant: Siemens Healthcare GmbH, Erlangen (DE)

(72) Inventor: David Grodzki, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 193 days.

(21) Appl. No.: 18/137,149

(22) Filed: Apr. 20, 2023

(65) Prior Publication Data

US 2023/0358838 A1 Nov. 9, 2023

(30) Foreign Application Priority Data

May 6, 2022 (DE) ..................... 10 2022 204 467.3

(51) Int. Cl.
*G01R 33/565* (2006.01)
*G01R 33/36* (2006.01)

(52) U.S. Cl.
CPC ... *G01R 33/56572* (2013.01); *G01R 33/3607* (2013.01)

(58) Field of Classification Search
CPC ......... G01R 33/56572; G01R 33/5608; G01R 33/56563; G01R 33/565; G01R 33/56509;

G01R 33/56518; G01R 33/56527; G01R 33/56536; G01R 33/56545; G01R 33/56554; G01R 33/5659

See application file for complete search history.

(56) References Cited

U.S. PATENT DOCUMENTS

| | | | |
|---|---|---|---|
| 10,466,329 B2 * | 11/2019 | Shu ..................... | G01R 33/543 |
| 2016/0313434 A1 * | 10/2016 | Panther ........... | G01R 33/56572 |
| 2021/0055365 A1 * | 2/2021 | Hoshiyama ...... | G01R 33/56572 |

(Continued)

FOREIGN PATENT DOCUMENTS

| | | | | |
|---|---|---|---|---|
| CN | 102967837 | * | 11/2016 | ......... G01S 15/8993 |

OTHER PUBLICATIONS

Sebastian Schmitter et al, Design of PTX RF Pulses Robust Against Respiration in Cardiac MRI at 7 Tesla, Nov. 19, 2014, Wiley. (Year: 2014).*

(Continued)

*Primary Examiner* — Lee E Rodak
*Assistant Examiner* — Jeremiah J Barron
(74) *Attorney, Agent, or Firm* — Lempia Summerfield Katz LLC

(57) ABSTRACT

A method, a magnetic resonance apparatus, and a computer program product are disclosed. In particular, a method is provided for determining an RF transmission pulse for a magnetic resonance scan by a magnetic resonance apparatus including a gradient coil unit. The method includes a provision of a deviation information item, wherein the deviation information item characterizes a position-dependent deviation from a target state, caused by the gradient coil unit, in an imaging region of the magnetic resonance apparatus. The RF transmission pulse is determined taking account of the deviation information item.

11 Claims, 5 Drawing Sheets

10 Magnetic resonance apparatus
11 Magnet unit
12 Main magnet
13 Main magnet field direction
14 Patient receiving unit
15 Patient
16 Patient positioning apparatus
17 Patient table
18 Gradient coil unit 20 Radio frequency antenna unit
22 System control unit
23 User interface
24 Display unit
25 Input unit

(56) References Cited

U.S. PATENT DOCUMENTS

| | | | |
|---|---|---|---|
| 2021/0124004 A1* | 4/2021 | Drobnitzky | G01R 33/56341 |
| 2021/0278492 A1 | 9/2021 | Grodzki et al. | |
| 2023/0098129 A1 | 3/2023 | Grodzki et al. | |

OTHER PUBLICATIONS

Herrler J. et al. "Fast online-customized (FOCUS) parallel transmission pulses: A combination of universal pulses and individual optimization." in Magnetic Resonance in Medicine; 85:3140-3153, 2021.

Grissom W. et al: "Spatial Domain Method for the Design of RF Pulses in Multicoil Parallel Excitation", Magnetic Resonance in Medicine 56, pp. 620-629, 2006.

Niederländer, Benjamin et al: "Simple eddy current compensation by additional gradient pulses"; Concepts in Magnetic Resonance Part A; vol. 47; No. 1; pp. 1-7, 2018.

Cavusoglu, Mustafa et al:; "Correction of parallel transmission using concurrent RF and gradient field monitoring"; Magnetic Resonance Materials in Physics; Biology and Medicine; Springer; vol. 30; No. 5; pp. 473-488; 2017.

* cited by examiner

10 Magnetic resonance apparatus
11 Magnet unit
12 Main magnet
13 Main magnet field direction
14 Patient receiving unit
15 Patient
16 Patient positioning apparatus
17 Patient table
18 Gradient coil unit 20 Radio frequency antenna unit
22 System control unit
23 User interface
24 Display unit
25 Input unit

METHOD FOR DETERMINING A RADIO-FREQUENCY TRANSMISSION PULSE FOR A MAGNETIC RESONANCE SCAN, A MAGNETIC RESONANCE APPARATUS, AND A COMPUTER PROGRAM PRODUCT

The present patent document claims the benefit of German Patent Application No. 10 2022 204 467.3, filed May 6, 2022, which is hereby incorporated by reference in its entirety.

TECHNICAL FIELD

The disclosure relates to a method for determining a radio-frequency (RF) transmission pulse for a magnetic resonance scan, a magnetic resonance apparatus, and a computer program product.

BACKGROUND

In medical technology, imaging by magnetic resonance (MR), also referred to as magnetic resonance tomography (MRT) or magnetic resonance imaging (MRI), is distinguished by high soft-tissue contrast levels. Herein, an examination object, in particular a patient, is positioned in an imaging region of a magnetic resonance apparatus. During a magnetic resonance scan, radio frequency (RF) transmission pulses may be radiated into the examination object with the aid of a transmitting coil arrangement of the magnetic resonance apparatus. By way of the pulses generated, magnetic resonance signals are excited and triggered in the patient. In addition, with the aid of a gradient coil unit of the magnetic resonance apparatus, temporary magnetic field gradients are generated in the imaging region, so that a position encoding is impressed upon the magnetic resonance signals. The triggered magnetic resonance signals are received by a receiving coil unit of the magnetic resonance apparatus and are used for the reconstruction of magnetic resonance images.

SUMMARY AND DESCRIPTION

In the absence of sufficient position encoding, artifacts, in particular deformations, may occur in the reconstructed magnetic resonance images. It is an object of the present disclosure to reduce any deformations in the magnetic resonance images.

The scope of the present disclosure is defined solely by the appended claims and is not affected to any degree by the statements within this summary. The present embodiments may obviate one or more of the drawbacks or limitations in the related art.

Thereby, a computer-implemented method for determining an RF transmission pulse for a magnetic resonance scan by a magnetic resonance apparatus including a gradient coil unit is proposed. The method includes providing a deviation information item, wherein the deviation information item characterizes (and/or maps and/or describes) a position-dependent deviation from a target state, caused by the gradient coil unit, in an imaging region of the magnetic resonance apparatus. The RF transmission pulse is determined taking account of the deviation information item.

The RF transmission pulse may be an excitation pulse for exciting magnetic resonance signals in an examination object, e.g., a patient. The RF transmission pulse may vary in amplitude, phase, and/or frequency.

The RF transmission pulse may be a spectrally selective excitation pulse. Spectrally selective may be regarded as meaning that the excitation pulse excites the different types of nuclear spin or bonding types in a predetermined manner only on the basis of different Larmor frequencies of the nuclear spin, caused by different nuclei, (or, e.g., by way of identical nuclei in different chemical compounds).

The imaging region may be an imaging layer or an imaging volume. The imaging region may be the spatial region in which magnetic resonance signals are generated that are received by the magnetic resonance apparatus during the magnetic resonance scan for the reconstruction of magnetic resonance images.

The magnetic resonance scan may be characterized in that during the magnetic resonance scan, a magnetic resonance sequence, in particular for capturing medically and/or diagnostically evaluable magnetic resonance signals, is carried out. A magnetic resonance sequence may provide a temporal sequence of different (e.g., partially repeating) sequence modules. Sequence modules may be RF transmission pulses (in particular, for exciting and/or manipulating magnetic resonance signals), gradient pulses (in particular for encoding magnetic resonance signals), and/or readout windows (in particular for receiving magnetic resonance signals).

A magnetic resonance scan may include the transmitting of a plurality of, in particular, sequential RF transmission pulses so that the method for determining an RF transmission pulse for a magnetic resonance scan may naturally also be carried out several times for a magnetic resonance scan.

The gradient coil unit may include one or more, (e.g., three), gradient coils. The gradient coils may be configured as pairs in the form of a Helmholtz coil pair or as saddle coils. The gradient coils may be configured to generate magnetic field gradients. For example, a first gradient coil generates a magnetic field gradient in a first direction X, a second gradient coil generates a magnetic field gradient in a second direction Y, and a third gradient coil generates a magnetic field gradient in a third direction Z. The directions X, Y, Z may be orthogonal to one another. In addition, the gradient control unit may include a gradient control unit for controlling the gradient coils.

Each gradient coil may generate a perfect linear field gradient in the imaging region. The target state may be a state according to which the gradient coil unit generates at least a perfect linear field gradient in the imaging region. The strength of the gradient magnetic field may change exactly linearly in dependence upon location. The target state may be a state according to which the strength of the gradient magnetic field changes exactly linearly in dependence upon location. For example, the gradient magnetic fields are oriented exclusively along the Z-direction, wherein the strength of the magnetic field in the Z-direction $B_z$ may modulate linearly in dependence upon the position coordinate (x,y,z), i.e. $B_z(x,y,z)=B_0+GX\cdot x+GY\cdot y+GZ\cdot z$. Therein, $B_0$ is the strength of the static main magnetic field $B_0$ oriented in the Z-direction; GX, GY, GZ are the gradient strengths in the directions X, Y and Z; $GX\cdot x+GY\cdot y+GZ\cdot z$ defines the resultant gradient magnetic field.

In fact, there may be deviations from this target state that may be caused, in particular, by the gradient coil unit. Such deviations may occur at the periphery of the imaging region. The deviation information item may at least partially define these deviations.

Advantageously, these deviations are taken into account in the determination of the RF transmission pulse so that any artifacts, in particular deformations, caused by the deviations are reduced in magnetic resonance images, which magnetic resonance images are generated by way of a reconstruction of magnetic resonance signals triggered by way of the RF transmission pulse. In particular, any gradient non-linearities may be corrected as early as during the recording of the magnetic resonance signals, so that possible subsequent corrections, for example, during or after the reconstruction of the magnetic resonance signals, to magnetic resonance images may be avoided.

The determination of the RF transmission pulse may take place, for example, by a computing unit. The computing unit may include one or more processors and/or one or more storage modules. The computing unit may be part of a system control unit of the magnetic resonance apparatus.

The deviation information item may be stored, for example, in a storage module, in particular, in a database. The deviation information item may be read out for preparation, for example, from the storage module. The computing unit may have an interface for receiving the deviation information item.

The position-dependent deviation may be caused by a non-linearity of a gradient magnetic field generated during the magnetic resonance scan. In particular, the gradient coil unit is not able to generate a linear gradient magnetic field in the imaging region. In particular, the deviation information item defines a non-linear behavior of the gradient coil unit. In particular, the deviation information item defines a deviation of a gradient magnetic field that is able to be generated by way of the gradient coil unit, from a target gradient magnetic field corresponding to the target state. In particular, the deviation information item characterizes at least one non-linearity of the gradient magnetic field that may (actually) be generated by way of the gradient coil unit.

In particular, the magnetic resonance apparatus includes a radio frequency antenna unit for transmitting an RF transmission pulse using the proposed method. By way of the transmission of the RF transmission pulse, a magnetic radio frequency alternating field B1 is radiated into the examination object. The RF transmission pulse may be emitted with the radio frequency antenna unit during the magnetic resonance scan. In particular, the RF-transmission pulse is radiated into the imaging region.

In order to transmit the RF transmission pulse, for example, a signal is provided in the base band which is then brought to the Larmor frequency by way of mixing and, by way of modulation, may be temporally varied in frequency and/or amplitude. The resultant radio frequency signal is subsequently amplified by a power stage of a transmitter of the magnetic resonance apparatus and emitted via a radio frequency antenna unit of the magnetic resonance apparatus, for example, a body coil and/or a local coil.

Thereby, magnetic resonance signals may advantageously be generated, the reconstruction of which leads to a magnetic resonance image with few artifacts, in particular deformations. The magnetic resonance signals may be received, for example, by the radio frequency antenna unit and passed to a further processing, in particular, a reconstruction of at least one magnetic resonance image. The radio frequency antenna unit may have a dedicated receiving coil unit, (e.g., at least one local coil), for receiving the magnetic resonance signals. The radio frequency antenna unit may have a transmitting-receiving coil unit configured both for transmitting the RF transmission pulse and also for receiving the magnetic resonance signals.

The method may also provide that with the gradient coil unit, a gradient magnetic field is generated, in particular, in a phase encoding direction and/or a readout direction according to a gradient trajectory, during the transmission of the radio frequency pulse. The gradient trajectory may be a predetermined gradient trajectory. The gradient trajectory may be a predetermined gradient trajectory that is generated unchanged during the transmission of the radio frequency pulse. The gradient trajectory may be a predetermined gradient trajectory that is adapted, (e.g., optimized), in the context of determining the RF transmission pulse while taking account of the deviation information item and is generated in accordance with the adaptation during the transmitting of the radio frequency pulse.

The generated gradient magnetic field may be a dynamic and/or temporally changeable gradient magnetic field. The generated gradient magnetic field may be suitable for encoding an excitation k-space. In particular, the gradient magnetic field does not serve for slice selection during the transmission of the radio frequency pulse.

The RF transmission pulse may be a dynamic pulse and/or a pTx-pulse.

An RF transmission pulse may be regarded, in particular, as a dynamic pulse, the phase and/or amplitude of which changes during the temporal course of the pulse, while an, in particular predetermined, gradient trajectory is sampled by the gradient coil unit. In particular, the sampling of the gradient trajectory takes place temporally with the variation of the phase and/or amplitude of the RF transmission pulse.

It is also conceivable to observe the totality of the RF transmission pulse and the gradient trajectory as a dynamic pulse. Then, the RF transmission pulse would be part of the dynamic pulse.

As used herein, "pTx" refers to "parallel transmission." A pTx pulse may include a plurality of partial pulses which are each transmitted in parallel, in particular simultaneously, by way of a transmitting coil of the radio frequency antenna unit. A transmitting channel may also be associated with each transmitting coil. Therein, the partial pulses may differ, in particular, in their shape and/or amplitude and/or phase. Furthermore, the partial pulses may have a temporal delay relative to one another. For example, an RF transmission pulse capable of being emitted is made up of a plurality of partial pulses that deviate from one another and may each be transmitted by way of a transmitting coil of a multichannel transmitting coil arrangement of the radio frequency antenna unit. At least a part of the plurality of partial pulses, in particular all the partial pulses, may be dynamic pulses.

By way of a dynamic pulse and/or a pTx pulse, advantageously, the B1 field thereby generated may be controlled more precisely. Such control may be advantageous for uses with a reduced field of view, shaped saturation bands, or for reducing the specific absorption rate (SAR). In particular, magnetic field inhomogeneities may be evened out with a pTx pulse (for example, in the context of an RF shimming), which may be advantageous, most particularly, with high main magnet field strengths, upwards from 7 tesla.

When a dynamic pulse and/or a pTx pulse is transmitted, advantageously, a predetermined spatial distribution of the excitation as an additional degree of freedom may be achieved by interference of the signals of the plurality of transmitting channels via a plurality of transmitting coils of the radio frequency antenna unit, which is adjusted during the determination of the pTx pulse, for example, by way of a variation of the phase and amplitude.

The at least one shape and/or amplitude and/or phase of the RF transmission pulse or of a partial pulse may correspond, for example, to a shape and/or amplitude and/or phase of a voltage pulse that is applied to the respective transmitting coil, and/or a current pulse which flows through the transmitting coil.

The at least one shape and/or amplitude and/or phase of the gradient pulse may correspond to a shape and/or amplitude and/or phase of a voltage pulse that is applied to the gradient coil unit and/or a current pulse which flows through the gradient coil unit.

In particular, inhomogeneities of the B1 field may lead to interfering signal and contrast variations. Advantageously, these variations are corrected during the actual magnetic resonance scan.

The determining of the radio frequency pulse may also be carried out while taking account of a B0 map and/or a B1 map. This may take place with pTx pulses as the RF transmission pulse.

On the basis of B0 and/or B1 maps, pulses adapted to the examination object that achieve, for example, a particular positional and/or frequency distribution and/or may balance out B1 effects, may advantageously be calculated. For example, an excitation according to a checkerboard pattern in position space may take place. Furthermore, for example, the RF transmission pulses may be dynamic fat saturation pulses which may take account of a B0 distribution in the position space.

Advantageously, the intended correction enables the desired frequencies to arrive at the necessary sites; without correction, these sites may lie at other locations, due to the gradient distortion.

In particular, with the RF transmission pulse, spatial variations in the B0 field may be taken into account and compensated for. In this way, as the case may be, the image quality may be improved, the effort for the compensation or prevention of B0 field deviations such as, e.g., active or passive shimming may be reduced or the electromagnetic burden (SAR) on the patient may be reduced or with the same burden, the image quality may be improved.

In contrast to the B1 field, a magnetic field that has temporal variations only with frequencies which lie significantly below the Larmor frequency, (e.g., by a factor of 10, 50, or greater than 50), is therein regarded as a B0 field. The B0 map may be stored in a memory store of the control system, for example, if it has already been established during production by way of measurement with a field camera or through calculation of a field distribution for the magnetic resonance apparatus. It is also conceivable, however, that the system control system establishes it in an up-to-the-moment manner at the beginning of a sequence by way of a magnetic resonance scan or by simulation, for example, taking account of the position and other properties of the patient or adjustments of the magnetic resonance apparatus such as shim currents through shim coils.

The deviation information item may include a deformation map, wherein the deformation map defines a spatial displacement of at least one image point of a magnetic resonance image. In particular, the spatial displacement of the at least one image point is caused by a non-linear behavior of the gradient coil unit.

The deformation map may be configured, in particular, two-dimensionally or three-dimensionally. The deviation information item, in particular the deformation map, may be defined by way of coefficients of at least one spherical harmonic function. The deformation map may attribute, for the at least one image point, at least one spatial position according to the target state, in particular according to an ideal gradient magnetic field, to a spatial position of an actual state. The deviation information item may define the deviation between the target state and the actual state.

Advantageously thereby, the deviation from the target state may be compensated for, so that the magnetic resonance image is equalized.

The deviation information item may be specific for a type of gradient coil unit, in particular, specific for the individual gradient coil unit of the magnetic resonance apparatus.

The deviation information item may be determined, for example, by a measurement.

The deviation information item may be determined, for example, by a phantom of known geometry. In particular, the deviation information item may be determined by way of a comparison of the known geometry with a measured geometry. The measured geometry may be derived, for example, from a magnetic resonance image of the phantom.

The deviation information item may be determined, for example, by a phantom of a gradient magnetic field generated with the gradient coil unit. For this purpose, for example, a measuring unit with at least one magnetic field sensor may be used. The measuring unit may be arranged in the imaging region in order to measure the gradient magnetic field. The deviation information item may be derived from a comparison of the measured gradient magnetic field with a theoretical (ideal) gradient magnetic field which may be configured perfectly linear.

The deviation information item may be calculated, for example, theoretically. The calculation involves, for example, the geometry and/or arrangement of the gradient coil unit, in particular, any gradient coils of the gradient coil unit. The calculation may be undertaken, for example, during development of a magnetic resonance apparatus.

A further embodiment of the method provides that the determination of the RF transmission pulse includes: preparing an initial target state in a position space; determining a modified target state in the position space on the basis of the deviation information item; determining a transformed target state in a k-space by transformation, in particular by a Fourier transform, of the modified target state in the k-space; and determining the RF transmission pulse on the basis of the transformed (in the k-space) target state.

The aforementioned k-space may also be designated the excitation k-space. The k-space may be a frequency space. The k-space and the position space may be converted into one another by way of a Fourier transform. The k-space, in particular, the excitation k-space, may be a k-space that samples the RF transmission pulse during the transmission.

The position space may be generated by way of one position coordinate axis, in particular, two or three coordinate axes. The position coordinate axes may be oriented, for example, in the X-direction, the Y-direction, and/or the Z-direction.

The initial target state may include a spatial frequency distribution of the RF transmission pulse, in particular, a spatial frequency distribution to be generated by way of the RF transmission pulse and/or a spatial frequency distribution to be generated by way of transmitting the RF transmission pulse and/or a B1 field to be generated by way of transmitting the RF transmission pulse.

The initial target state may include, in particular, a spatial frequency distribution to be generated by way of transmitting the RF transmission pulse and/or a B1 field to be generated by way of transmitting the RF transmission pulse.

Advantageously, the modified target state takes account of any non-linearities of the gradient coil unit. In particular, the modified target state may be deformed relative to the initial target state in accordance with the deviation information item. The modified target state may be deformed as is to be expected for the position space distribution. In order to determine the modified target state, all the position space coordinates of the initial target state may be transformed into a deformed and/or distorted space.

The determination of the RF transmission pulse on the basis of the target state transformed into the k-space may take place according to different methods of the prior art. By way of example, reference is made here to the publications by Grissom, Yip, Zhang, Stenger, Fessler and Noll: "*Spatial domain method for the design of RF pulses in multicoil parallel excitation*," Magn. Reson. Med. 2006, 56: 620-629 and by Herrler, Liebig, Gumbrecht et al.: "*Fast online-customized (FOCUS) parallel transmission pulses: A combination of universal pulses and individual optimization*," Magn. Reson. Med. 2021; 85: 3140-3153.

Furthermore, a magnetic resonance apparatus is proposed which is configured to carry out a method according to one of the preceding claims. The magnetic resonance apparatus includes a gradient coil unit which causes a position-dependent deviation from the target state in an imaging region of the magnetic resonance apparatus.

The magnetic resonance apparatus may include, in particular, a computing unit configured to determine at least one RF-transmission pulse for a magnetic resonance scan. The magnetic resonance apparatus may include, in particular, a radio frequency antenna unit for transmitting the RF-transmission pulse.

The advantages of the proposed magnetic resonance apparatus substantially correspond to the advantages of the method for determining an RF transmission pulse for a magnetic resonance scan, as described in detail above. Features, advantages, or alternative embodiments mentioned herein may also be transferred to the other claimed subject matter and vice versa.

Furthermore, a computer program product is proposed that includes a program and is able to be loaded directly into a memory store of a programmable computing unit of a magnetic resonance apparatus, and has program means, (e.g., libraries and auxiliary functions), in order to carry out a proposed method for determining an RF transmission pulse for a magnetic resonance scan when the computer program product is executed in the computing unit of the magnetic resonance apparatus. The computer program product may herein include an item of software with a source code that is compiled and linked or interpreted, or an executable software code which, for execution, is loaded into the computing unit. By the computer program product, the method may be carried out rapidly, exactly reproducibly, and robustly. The computer program product is configured such that it may carry out the method acts as disclosed herein by the computing unit. In each case, the computing unit includes the respective pre-conditions such as, for example, a suitable working memory store, a suitable graphics card, or a suitable logic unit, such that the respective method acts may be carried out efficiently.

The computer program product is stored, for example, on a computer-readable medium or is deposited on a network or server from where it may be loaded into the processor of a local computing unit which may be directly connected to the magnetic resonance apparatus or may be configured as part of the magnetic resonance apparatus. Furthermore, control information of the computer program product may be stored on an electronically readable data carrier. The items of control information of the electronically readable data carrier may be configured such that they carry out a method when the data carrier is used in a computing unit of a magnetic resonance apparatus. Examples of electronically readable data carriers include a DVD, a magnetic tape, or a USB stick, on which electronically readable control information, in particular software, is stored. If this control information is read from the data carrier and is stored in a computing unit of the magnetic resonance apparatus, the embodiments of the above-described methods may be carried out. The disclosure may therefore also proceed from the aforementioned computer-readable medium and/or the aforementioned electronically readable data carrier.

Further advantages, features, and details of the disclosure are described in the exemplary embodiments and the drawings. Parts that correspond to one another are provided with the same reference signs in all the figures.

DETAILED DESCRIPTION

Figure 1:
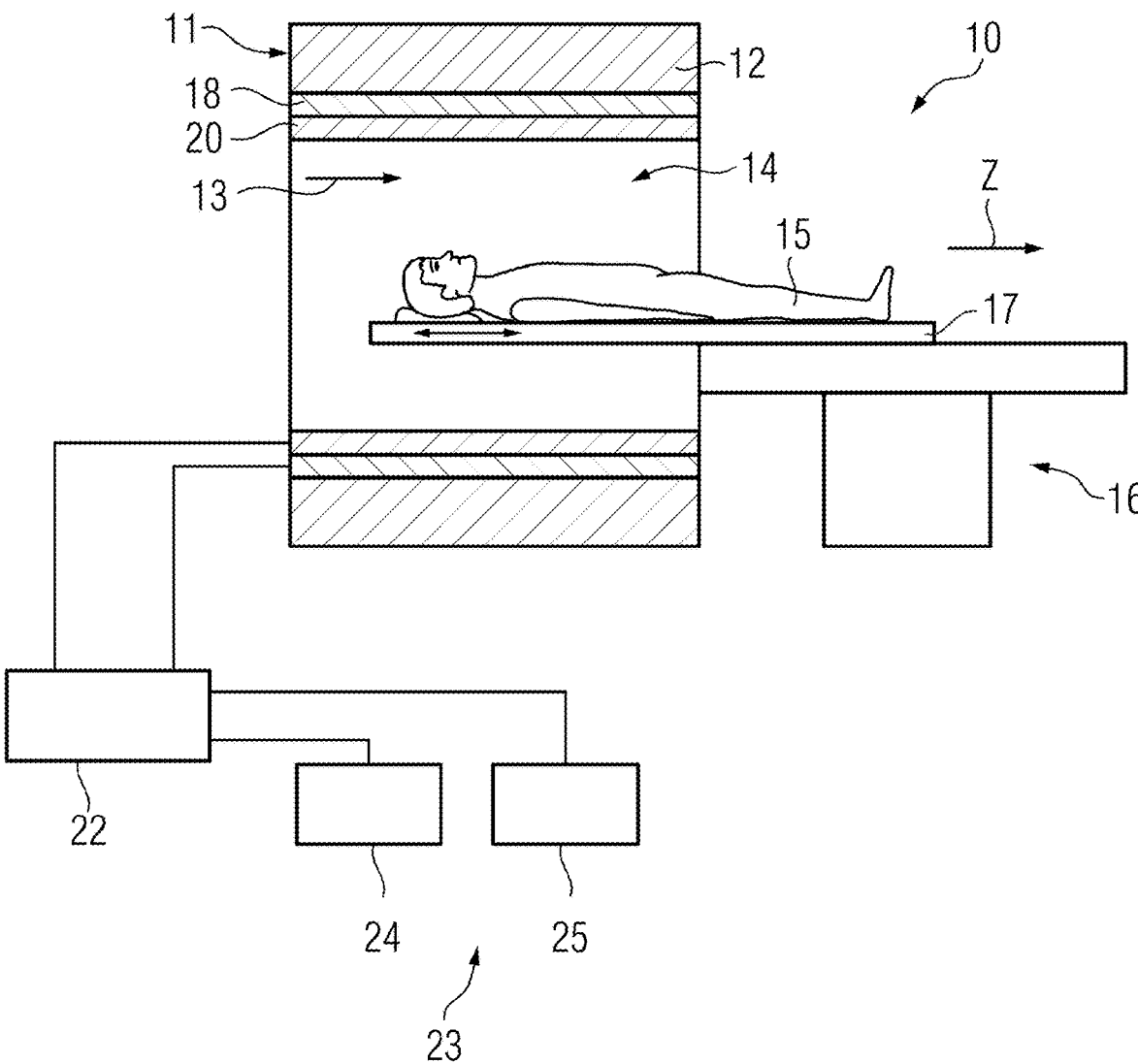
FIG. 1 depicts an example of a magnetic resonance apparatus in a schematic representation.

FIG. 1 shows a magnetic resonance apparatus 10 in a schematic representation. The magnetic resonance apparatus 10 includes a magnet unit 11 that has a main magnet 12 for generating a strong and, in particular, temporally constant main magnetic field $B_0$. In addition, the magnetic resonance apparatus 10 includes a patient receiving region 14 to accommodate a patient 15. In the present exemplary embodiment, the patient receiving region 14 is configured cylindrical and is surrounded cylindrically in a circumferential direction by the magnet unit 11. Parallel to the direction of the main magnetic field $B_0$, the main magnet field direction 13, the cylindrical axis of the patient receiving region 14, the Z-axis, extends in the spatial direction Z. The patient 15 may be moved by a patient positioning apparatus 16 of the magnetic resonance apparatus 10 into the patient receiving region 14. For this purpose, the patient positioning apparatus 16 has a patient table 17 which is designed to be movable within the patient receiving region 14.

Figure 2:
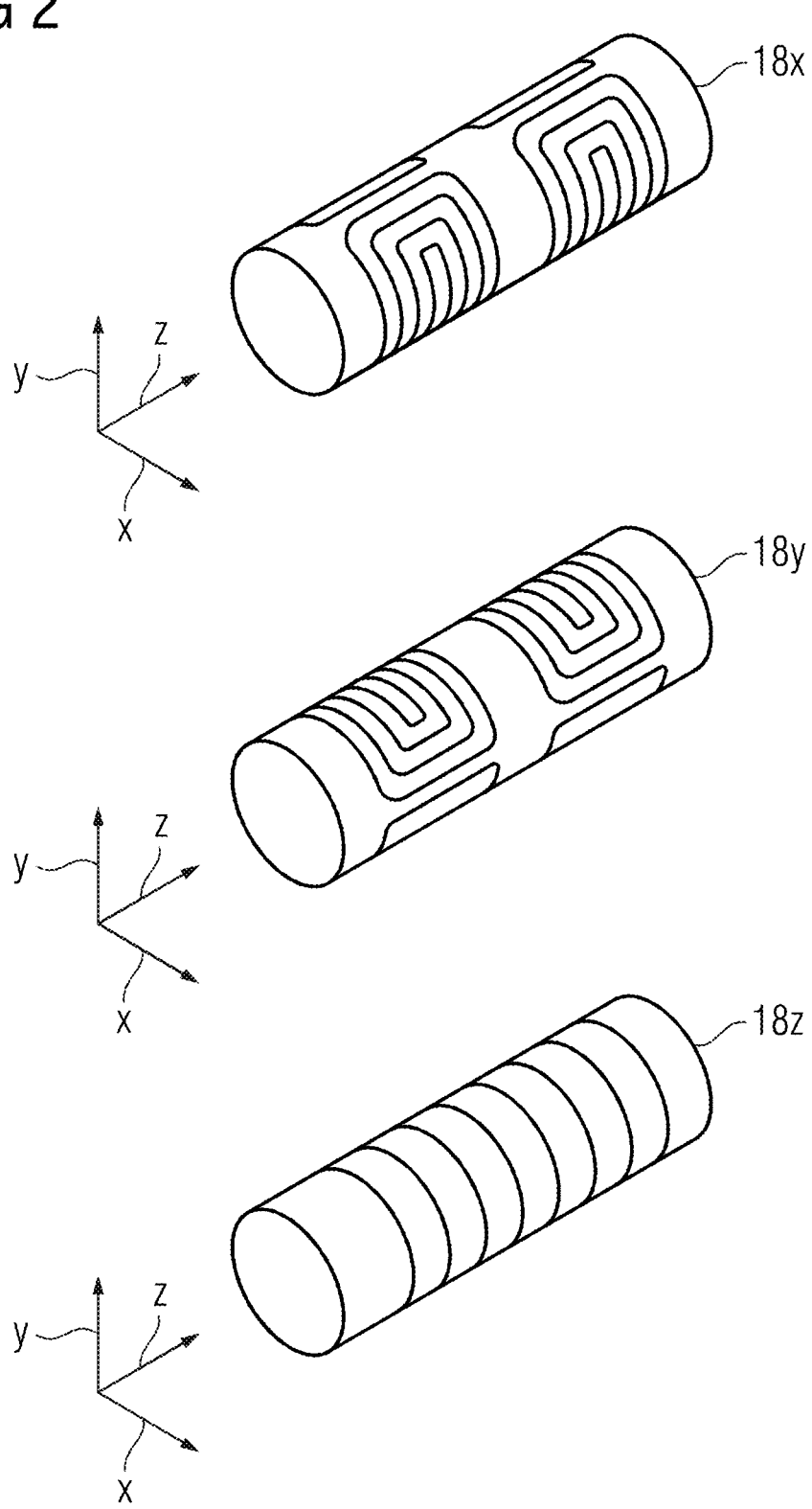
FIG. 2 depicts examples of parts of a gradient coil unit.

The magnet unit 11 also has a gradient coil unit 18 (with a plurality of gradient coils as shown in FIG. 2) for generating gradient magnetic fields that are overlaid on the main magnet field $B_0$ 13 and are used, in particular, for position encoding during imaging. The gradient coil unit 18 includes a gradient control unit (not shown here) of the magnetic resonance apparatus 10. The magnet unit 11 further includes a radio frequency antenna unit 20 that, in the present exemplary embodiment, has a body coil which is permanently integrated into the magnetic resonance apparatus 10. The radio frequency antenna unit 20 may include a plurality of transmitting coils so that pTx pulses may also be transmitted with it. The radio frequency antenna unit 20 includes a radio frequency antenna control unit (not shown here) and transmits, in particular, RF transmission pulses into a patient receiving region 14 of the magnetic resonance apparatus 10. Situated in the patient receiving region 14 is an imaging region of the magnetic resonance scan, in which an excitation of atomic nuclei takes place. By way of relaxation of the excited atomic nuclei, magnetic resonance signals are generated. The radio frequency antenna unit 20 is designed to receive the magnetic resonance signals.

For control of the main magnet 12, the gradient coil unit 18 and the radio frequency antenna unit 20, the magnetic resonance apparatus 10 has a system control unit 22. The system control unit 22 centrally controls the magnetic resonance apparatus 10, for example, the execution of a predetermined imaging gradient echo sequence. In addition, the system control unit 22 includes an evaluation unit (not shown in detail) for evaluating the magnetic resonance signals captured during the magnetic resonance examination. The system control unit 22 may further include a computing unit configured to determine an RF-transmission pulse for a magnetic resonance scan (in particular with a method according to FIG. 3), which may be transmitted with the radio frequency antenna unit 20.

Furthermore, the magnetic resonance apparatus 10 includes a user interface 23 connected to the system control unit 22. Control information, (e.g., imaging parameters and reconstructed magnetic resonance images), may be displayed on a display unit 24, (e.g., on at least one monitor of the user interface 23), for medical operating personnel. In addition, the user interface 23 has an input unit 25 by which the information and/or parameters may be input by the medical operating personnel during a scanning procedure.

Figure 4:
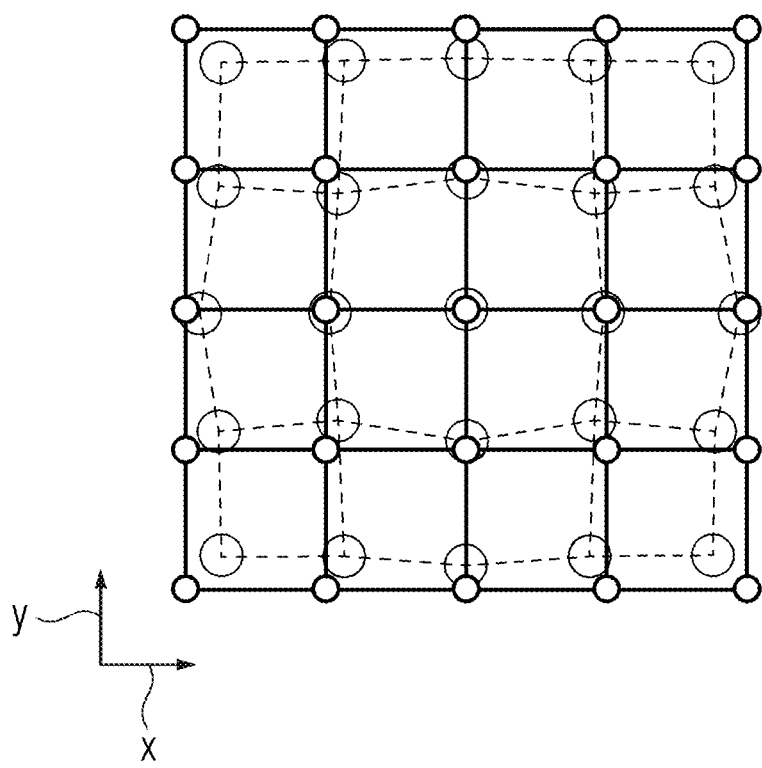
FIG. 4 depicts an example of a schematic representation of a deformation map.

FIG. 2 shows three gradient coils 18x, 18y, 18z of the gradient coil unit 18. The gradient coil 18x generates a gradient magnetic field with a gradient of the value of the magnetic field in the X-direction. The gradient coil 18y generates a gradient magnetic field with a gradient of the value of the magnetic field in the Y-direction. The gradient coil 18z generates a gradient magnetic field with a gradient of the value of the magnetic field in the Z-direction. The vector fields of the three gradient magnetic fields are ideally (only) oriented in the Z-direction. The gradients may have non-linearities that may lead, in particular, to deformations, in particular, displacements of image points (shown schematically in FIG. 4) in magnetic resonance images.

During the transmission of a dynamic pulse and/or pTx pulse, a rapid sequence of gradient trajectories may be played out with the gradient coil unit 18. These gradient trajectories are also subject to any imperfections of the gradient coil unit 18 which lead to position-dependent deviations from a target state in an imaging region of the magnetic resonance apparatus 10.

Figure 3:
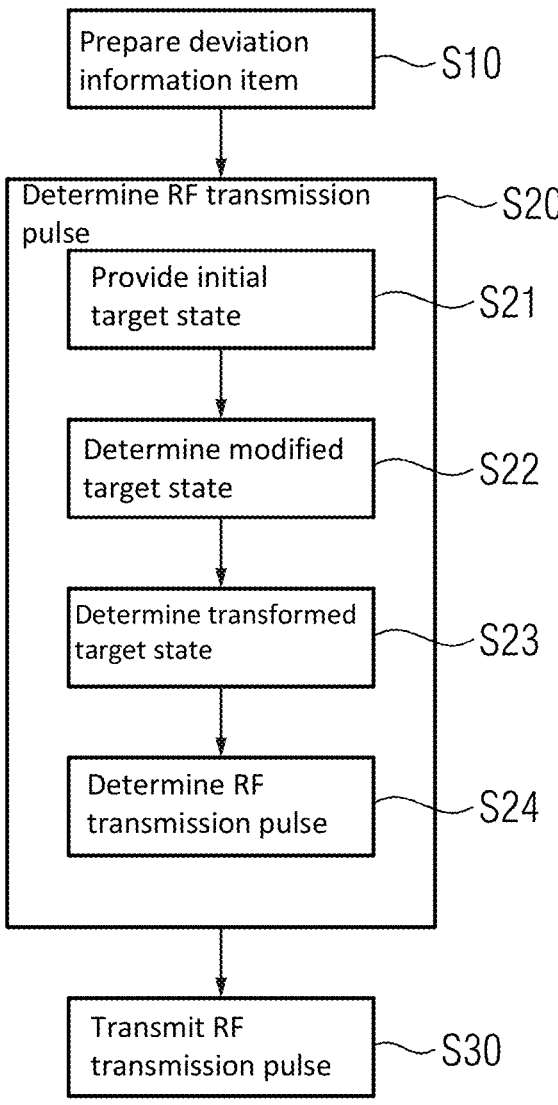
FIG. 3 depicts an example of a method sequence.

FIG. 3 illustrates a method for determining an RF transmission pulse in order to correct such imperfections at least partially as early as during the magnetic resonance scan. In S10, a deviation information item is prepared which characterizes a position-dependent deviation from a target state, caused by the gradient coil unit 18, in an imaging region of the magnetic resonance apparatus 10.

The position-dependent deviation may be caused by a non-linearity of a gradient magnetic field generated by the gradient coil unit during the magnetic resonance scan.

In S20, the RF transmission pulse, (e.g., a pTx pulse), is determined taking account of the deviation information item. The determining of the radio frequency pulse may also be carried out taking account of a B0 map and/or a B1 map. In S30, the RF-transmission pulse may be transmitted with the radio frequency antenna unit 20 into the imaging region during the magnetic resonance scan.

The determination of the RF-transmission pulse taking account of the deviation information item in S20 may include, in particular: in S21, an initial target state is provided in a position space. The initial target state may include, in particular, a spatial frequency distribution of the RF-transmission pulse.

In S22, a modified target state is determined in the position space based on the deviation information item. In S23, a transformed target state is determined in a k-space by transformation, in particular by a Fourier transform, of the modified target state in the k-space. Such a k-space may also be designated the excitation k-space. In S24, the RF transmission pulse is determined based on the transformed target state.

Advantageously, a correction of distorting effects may be taken into account by way of gradient non-linearities in the excitation k-space of a dynamic or pTx pulse. The target state of the excitation may be subjected to a distortion that corresponds to the distortion characteristic of the magnetic resonance apparatus 10. In particular, the method may make it possible for dynamic pulses to be performed in off-center positions and therein to take account of the influences of the gradient coil unit 18.

In particular, the deviation information item may be a deformation map that defines a spatial displacement of at least one image point of a magnetic resonance image. This is now described in greater detail by reference to FIG. 4. The solid points connected with continuous lines herein represent the allocation of a plurality of image points of a magnetic resonance image that arises if the position encoding of the image points were to take place with perfectly linear gradients. Non-linearities of the gradient coil unit 18 may lead to the position encoding of the image points (represented by hollow points connected by dashed lines) being faulty so that at least one part of the image points has a spatial displacement. With the aid of such a deformation map which may be measured, for example, with the aid of a phantom and/or may be calculated with the aid of a simulation of the gradient coil unit 18, the RF transmission pulse may be determined in S20.

Figure 5:
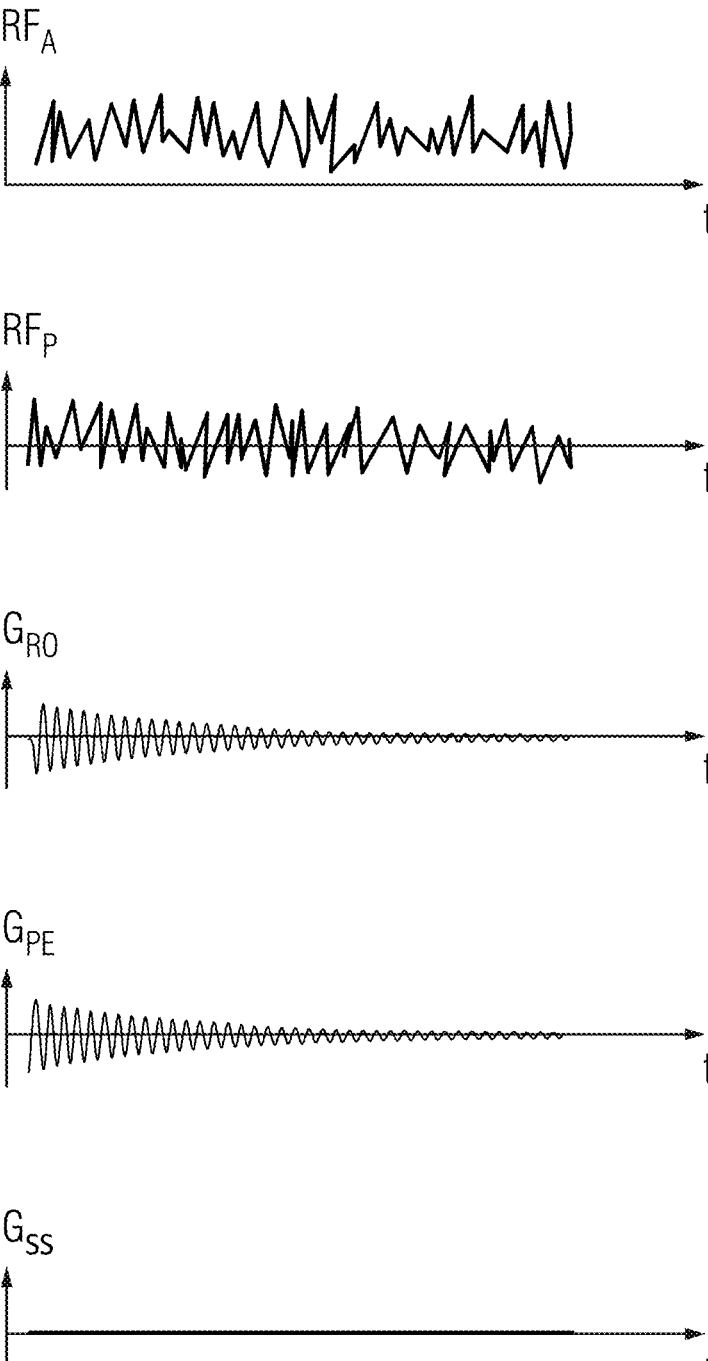
FIG. 5 depicts an example of a portion of a magnetic resonance sequence during the transmission of an RF transmission pulse.

FIG. 5 shows a short portion along the time axis t from a sequence diagram according to which a gradient magnetic field is generated during the transmission of the RF transmission pulse. The RF transmission pulse shown here may be regarded, in particular, as a dynamic pulse. Therein, $RF_A$ and $RF_p$ are the amplitude and phase of the RF transmission pulse. $G_{RO}$ represents the strength of the gradient on the readout axis, $G_{PE}$ represents the strength of the gradient on the phase encoding axis and $G_{ss}$ represents the strength of the gradient on the slice selection axis. Therein, the readout axis, phase encoding axis and slice selection axis are virtual gradient axes; depending upon the orientation of the slice to be scanned, the readout axis, the phase encoding axis and the slice selection axis may coincide completely or partially with the physical axes of the gradient coils 18x, 18y, 18z (that is the X-direction, the Y-direction and the Z-direction), or not. According to this example, a gradient magnetic field is generated in the phase encoding direction and the readout direction during the transmission of the RF transmission pulse. By contrast, no gradient magnetic field is generated in the slice selection direction. Such dynamic gradient magnetic fields are suitable, in particular, for encoding the excitation k-space during the transmission of dynamic pulses and/or pTx pulses.

Finally, it should again be noted that the method described above in detail and the magnetic resonance apparatus disclosed are merely exemplary embodiments which may be modified by a person skilled in the art in a broad variety of ways without departing from the scope of the disclosure. Furthermore, the use of the indefinite article "a" or "an" does not preclude the possibility that the relevant features may also be present plurally. Similarly, the expression "unit" does not preclude the relevant components including a plurality of cooperating sub-components that may also be spatially distributed, if relevant.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for determining a radio-frequency (RF) transmission pulse for a magnetic resonance scan of an examination object by a magnetic resonance apparatus comprising a gradient coil unit, the method comprising:

providing, by a computing unit, a deviation information item, wherein the deviation information item characterizes a position-dependent deviation from a target state, caused by the gradient coil unit, in an imaging region of the magnetic resonance apparatus, wherein the deviation information item comprises a deformation map that defines spatial displacements of a plurality of image points of a magnetic resonance image, and wherein the deformation map attributes a respective spatial position according to the target state to a respective spatial position of an actual state for each image point of the plurality of image points;

providing, by the computing unit, an initial target state in a position space;

determining, by the computing unit, a modified target state in the position space relative to the initial target state using the deformation map taking into account non-linearities of the gradient coil unit;

determining, by the computing unit, a transformed target state in a k-space by transformation of the modified target state into the k-space;

determining, by the computing unit, the RF transmission pulse based on the transformed target state, wherein the RF transmission pulse is a dynamic pulse;

conducting, by the magnetic resonance apparatus, the magnetic resonance scan of the examination object; and transmitting the RF transmission pulse, by a radio frequency antenna unit of the magnetic resonance apparatus, during the magnetic resonance scan.

2. The method of claim 1, wherein the position-dependent deviation is caused by a non-linearity of a gradient magnetic field generated by the gradient coil unit during the magnetic resonance scan.

3. The method of claim 2, further comprising:

generating the gradient magnetic field, according to a gradient trajectory, during the transmitting of the RF transmission pulse.

4. The method of claim 3, wherein the gradient magnetic field is generated in a phase encoding direction and/or a readout direction.

5. The method of claim 1, further comprising:

generating a gradient magnetic field, according to a gradient trajectory, during the transmitting of the RF transmission pulse.

6. The method of claim 5, wherein the gradient magnetic field is generated in a phase encoding direction and/or a readout direction.

7. The method of claim 1, wherein the determining of the RF transmission pulse also takes into account a B0 map and/or a B1 map.

8. The method of claim 1, wherein the determining of the transformed target state is performed by a Fourier transform.

9. The method of claim 1, wherein the initial target state comprises a spatial variation in a B0 field of the RF transmission pulse.

10. A magnetic resonance apparatus comprising:

a computing unit; and a gradient coil unit, wherein the magnetic resonance apparatus is configured to:

provide, by the computing unit, a deviation information item, wherein the deviation information item characterizes a position-dependent deviation from a target state, caused by the gradient coil unit, in an imaging region of the magnetic resonance apparatus, wherein the deviation information item comprises a deformation map that defines spatial displacements of a plurality of image points of a magnetic resonance image, and wherein the deformation map attributes a respective spatial position according to the target state to a respective spatial position of an actual state for each image point of the plurality of image points;

provide, by the computing unit, an initial target state in a position space;

determine, by the computing unit, a modified target state in the position space relative to the initial target state using the deformation map taking into account non-linearities of the gradient coil unit;

determine, by the computing unit, a transformed target state in a k-space by transformation of the modified target state into the k-space; and determine, by the computing unit, a radio-frequency (RF) transmission pulse based on the transformed target state, wherein the RF transmission pulse is a dynamic pulse;

conduct a magnetic resonance scan of an examination object; and transmit the RF transmission pulse, by a radio frequency antenna unit of the magnetic resonance apparatus, during the magnetic resonance scan.

11. A non-transitory computer program product comprising a program configured to be loaded directly into a memory store of a programmable computing unit of a magnetic resonance apparatus, wherein, when the program is executed in the programmable computing unit of the magnetic resonance apparatus, the program is configured to cause the magnetic resonance apparatus to:

provide a deviation information item, wherein the deviation information item characterizes a position-dependent deviation from a target state, caused by a gradient coil unit of the magnetic resonance apparatus, in an imaging region of the magnetic resonance apparatus, wherein the deviation information item comprises a deformation map that defines spatial displacements of a plurality of image points of a magnetic resonance image, and wherein the deformation map attributes a respective spatial position according to the target state to a respective spatial position of an actual state for each image point of the plurality of image points;

provide an initial target state in a position space;

determine a modified target state in the position space relative to the initial target state using the deformation map taking into account non-linearities of the gradient coil unit;

determine a transformed target state in a k-space by transformation of the modified target state into the k-space;

determine a radio-frequency (RF) transmission pulse based on the transformed target state, wherein the RF transmission pulse is a dynamic pulse;

conduct a magnetic resonance scan of an examination object; and transmit the RF transmission pulse, by a radio frequency antenna unit of the magnetic resonance apparatus, during the magnetic resonance scan by the magnetic resonance apparatus.

\* \* \* \* \*